(12) United States Patent
Berkhout et al.

(10) Patent No.: US 8,502,601 B2
(45) Date of Patent: Aug. 6, 2013

(54) INTEGRATED CIRCUIT

(75) Inventors: Marco Berkhout, Tiel (NL); Lutsen Ludgerus Albertus Hendrikus, Brummen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/558,143

(22) Filed: Jul. 25, 2012

(65) Prior Publication Data

US 2013/0049855 A1    Feb. 28, 2013

(30) Foreign Application Priority Data

Aug. 24, 2011   (EP) ..................... 11178703

(51) Int. Cl.
*H03F 3/217*   (2006.01)
(52) U.S. Cl.
USPC ............................ 330/207 A; 330/2; 330/251
(58) Field of Classification Search
USPC .................................. 330/10, 251, 207 A, 2
See application file for complete search history.

(56) References Cited

U.S. PATENT DOCUMENTS

| | | | |
|---|---|---|---|
| 6,414,614 B1 * | 7/2002 | Melanson | 341/143 |
| 7,859,331 B2 * | 12/2010 | Beale et al. | 330/10 |
| 2009/0315623 A1 | 12/2009 | Dooper et al. | |

FOREIGN PATENT DOCUMENTS

| | | |
|---|---|---|
| EP | 2 211 331 A1 | 7/2010 |
| WO | 2009/098609 A1 | 8/2009 |

OTHER PUBLICATIONS

Berkhout, M., et al. "Class-D Audio Amplifiers in Mobile Applications"; IEEE Transs. on Circuits and Systems—I: Regular Papers, vol. 57, No. 5, pp. 992-1002 (2010).
Extended European Search Report for European patent appln. No. 11178703.2 (Dec. 27, 2011).

* cited by examiner

*Primary Examiner* — Hieu Nguyen

(57) ABSTRACT

An integrated circuit comprising a Class-D amplifier for amplifying an input signal at an input terminal is disclosed. The Class-D amplifier is switchable between an operational mode, in which a comparator (4) is directly coupled to an output stage (5), and a test mode, in which the comparator (4) is coupled to the output stage (5) via a sampler (15) and the output stage (5) is coupled to the input terminal via a feedback network, whereby a digital representation of the input signal is available at an output of the sampler (15).

14 Claims, 2 Drawing Sheets

INTEGRATED CIRCUIT

CROSS-REFERENCE TO RELATED APPLICATIONS

This application claims the priority under 35 U.S.C. §119 of European patent application no. 11178703.2, filed on Aug. 24, 2011, the contents of which are incorporated by reference herein.

The invention relates to an integrated circuit comprising a Class-D amplifier for amplifying an input signal at an input terminal and to a method of testing such an integrated circuit.

Class-D amplifiers are commonly used as speaker drivers in consumer, automotive and mobile applications. In most Class-D amplifiers some form of pulse-width modulation (PWM) of the input signal is used. A PWM signal can be generated by comparing an input signal with a triangular wave reference signal. Usually the frequency of the reference signal is much higher than that of the input signal, e.g. around 350 kHz or $8 \times f_s$, where $f_s$ is the sampling frequency of audio signals, e.g. 44.1 kHz.

Ideally, the spectrum of the PWM signal does not contain harmonics of the modulating signal, which means it can be considered ideal in terms of distortion. Many Class-D amplifiers use an integrating feedback loop to provide power supply rejection and correction of switching errors in the output stage.

In mobile applications, most audio sources can be assumed to be digital, whereas an audio signal is analogue by nature. This means that, somewhere between the audio source and the loudspeaker, digital-to-analogue (D/A) conversion has to be performed. Since audio D/A converters usually employ noise shaping, the combination of a digital-to-analogue converter (DAC) with closed-loop class-D amplifiers requires dedicated architectures to avoid inter-modulation of out-of-band quantization noise back into the audio band.

An example is shown in FIG. 1. In this, the PWM generation is performed in the digital domain (not shown) by converting an input signal in a common digital format, e.g. I²S or DSD, into a digital PWM signal, designated dpwm in FIG. 1. An important property of the dpwm signal is that it is a synchronous signal, i.e. the edges of the signal are synchronized to a system clock that is running at a much higher frequency, e.g. $2048 \times f_s$. A one-bit DAC 1 converts the dpwm signal to an analogue current $I_{DPWM}$ that is injected into the virtual ground of a first integrator 2. Because the input signal is already in PWM format, no clock reference is needed. Together with a second integrator 3, the first integrator 2 forms a second order low-pass filter. The outputs from the first 2 and second 3 integrators feed non-inverting and inverting inputs of a comparator 4, which generates a signal, designated comp in FIG. 1, for driving the output stage 5.

With zero modulation, the comp signal is a delayed version of the dpwm input signal. When positive modulation is applied, the duty-cycle of the comp signal is greater than that of the dpwm signal. On the other hand, when negative modulation is applied, the duty-cycle of the comp signal is less than that of the dpwm signal. One effect of the feedback loop is that the modulation of the dpwm input signal is inflated. As a consequence, the comp signal is an asynchronous signal, i.e. the edges of the comp signal are no longer synchronized to the system clock.

The comp signal is fed directly into the output stage that reproduces the signal with a very small delay and at a higher power level. Although the output signal, $V_{PWM}$, appears to be digital, it is essentially analogue. A feedback current representing the output signal, $V_{PWM}$, is fed back to the input of the first integrator 2 via a feedback resistor 6, and the audio signal, $V_O$, is recovered from the PWM signal by a filter comprising inductor 7 and capacitor 8. This audio signal, $V_O$, drives a load 9 (for example, a speaker).

Integrated circuits comprising such class-D amplifiers are produced in high volumes and in order to guarantee the quality of each product they are industrially tested on wafer, i.e. before sawing the wafer into individual circuits and packaging. Industrial testing is done with dedicated test equipment that includes programmable signal and supply generators, voltage and current meters and digital interfaces. The individual products are contacted with needle probes that are precisely arranged in a so-called probe card to exactly match the positions of the bonding openings of the products. For audio amplifiers, the test includes a number of key specification items such as distortion (THD), noise (SNR), power supply rejection (PSR), gain and offset.

To enable the audio measurements some external hardware has to be added in the test set-up. For a typical class-D bridge amplifier, the additional hardware consists of a low-pass filter (LPF) and a precision analogue-to-digital converter (ADC) for each amplifier. The input signal for the class-D amplifier under test is generated by the dedicated test equipment and the output signal from the class-D amplifier is fed to the LPF and ADC. The digital output of the ADC is fed back to the dedicated test equipment for analysis. The LPFs and ADCs are assembled on a circuit board called a handler that also contains the probe card and serves as an interface between the amplifier under test and the dedicated test equipment.

The cost of the industrial test is a significant part of the total product price and is proportional to the total time taken to complete the test. In order to speed up the test time, it is advantageous to test amplifiers in parallel. When testing parallel, or multi-site, multiple amplifiers are contacted with one single probe card. However, the amount of space on the handler is limited. In some cases this means that the external hardware required to do the audio measurements is actually the limiting factor in the number of sites that can be tested in parallel.

Another problem relates to the quality of measurement. The industrial test environment is rather noisy, which makes it difficult to perform sensitive measurements.

According to a first aspect of the invention, there is provided an integrated circuit comprising a Class-D amplifier for amplifying an input signal at an input terminal, the Class-D amplifier being switchable between an operational mode, in which a comparator is directly coupled to an output stage, and a test mode, in which the comparator is coupled to the output stage via a sampler and the output stage is coupled to the input terminal via a feedback network, whereby a digital representation of the input signal is available at an output of the sampler.

The invention exploits the similarity between the PWM control loop of the amplifier shown in FIG. 1 and a continuous-time $\Sigma\Delta$ analogue-to-digital converter (ADC). A block diagram of such an ADC is shown in FIG. 2. This consists of a low-pass continuous-time loop filter 10 followed by a binary quantiser 11 (i.e. a comparator) and finally a sampler 12 that synchronises the output signal to a clock that runs at an oversampling rate OSR times the Nyquist sampling frequency of the input signal $f_s$. The loop is closed by feeding the digital output signal back to the input with a DAC 13. The analogue output of DAC 13 is added to the analogue input signal by adder 14.

The main difference between the PWM feedback loop of FIG. 1 and this ADC is that the output of quantiser 11 is clocked with a sampler 12 (in this case a D-type flip-flop) that produces the digital output signal of the loop that is then fed back to the input by the DAC 13.

Thus, by providing an amplifier switchable between an operational mode, in which the sampler is effectively bypassed (i.e. a direct coupling of the comparator to the output stage), and a test mode in which a sampler is coupled between the comparator and the output stage, the PWM control loop can be reconfigured as a second-order ΣΔ ADC. Thus, at very little expense an ADC suitable for making the audio measurements can be integrated with the class-D amplifier, and such ADCs are no longer required on the handler. This reduces the cost of the handler and overcomes the problem discussed above of providing multiple parallel ADC channels on the handler. Furthermore, the effects of noise in the test environment are mitigated.

The sampler will typically be a D-type flip-flop.

Normally, the output stage is a switching output stage.

Typically, the output stage is coupled to an output terminal.

In a preferred embodiment, the integrated circuit may further comprise an input digital-to-analogue converter (DAC) with an output coupled to the input terminal.

In this embodiment, the output of the sampler may be coupled to an input of the input DAC and the output stage may be coupled to a ground terminal via a switch. The output of the sampler is typically coupled to an input of the input DAC via a buffer, which may be an inverting buffer.

Typically, the integrated circuit further comprises a low-pass filter between the input terminal and the comparator. The low-pass filter is normally a second order low-pass filter.

Typically, the feedback network is a resistor coupled from the output stage to the input terminal.

The sampler is normally driven by a clock running at an oversampling frequency.

The integrated circuit may further comprise a digital signal processor (DSP) for receiving the digital representation at the output of the sampler and analysing the received digital representation in accordance with a predetermined test protocol.

In accordance with a second aspect of the invention, there is provided a method of testing an integrated circuit according to the first aspect of the invention, the method comprising switching the integrated circuit into the test mode, coupling a test signal to the input terminal, receiving the digital representation at the output of the sampler, and analysing the output signal in accordance with a predetermined test protocol.

The predetermined test protocol typically includes analyses of the signal-to-noise ratio (SNR), total harmonic distortion (THD) and power supply rejection (PSR).

The analysis of the output signal in accordance with the predetermined test protocol may be performed by a DSP integrated on the integrated circuit.

Examples of the invention will now be described in detail with reference to the accompanying drawings, in which.

Figure 1:
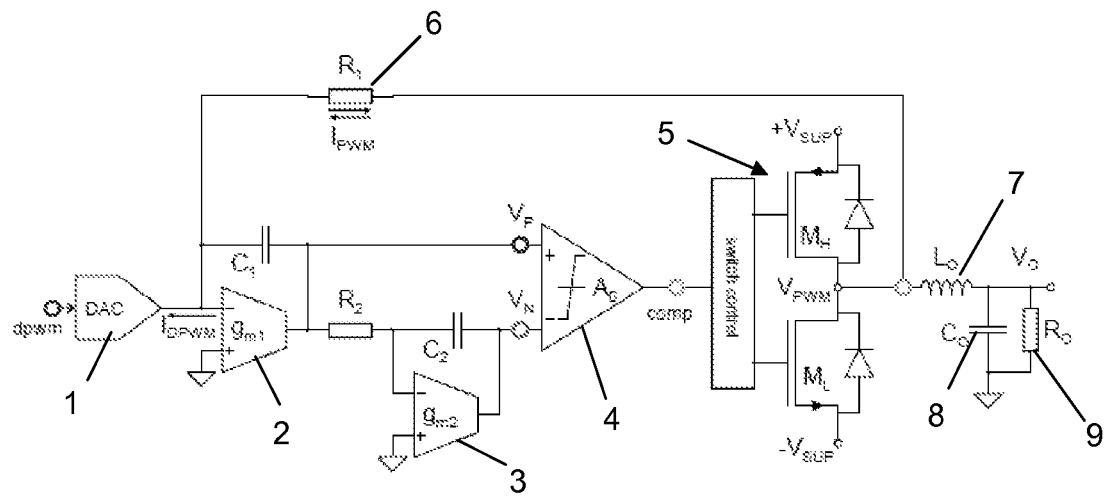
FIG. 1 shows a prior art class-D amplifier circuit.
Figure 3:
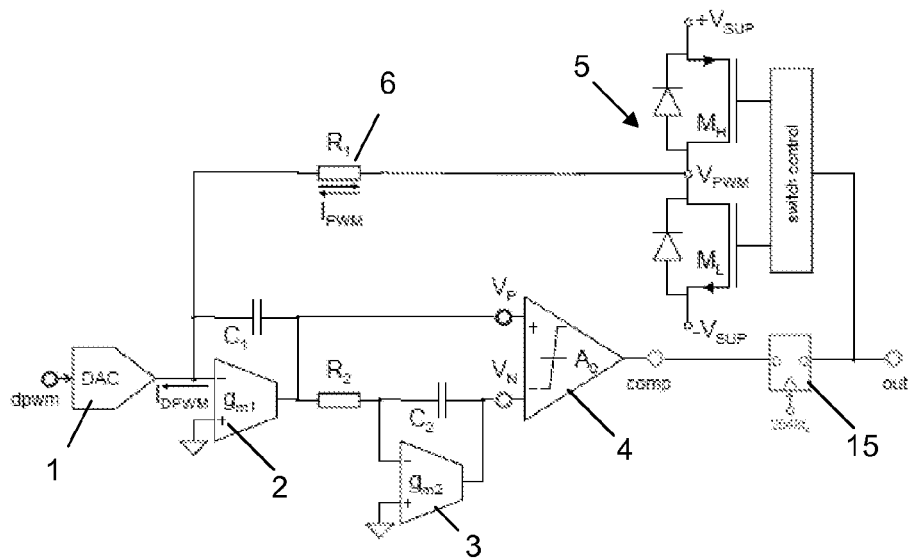
FIG. 3 shows a first embodiment according to the invention.

In FIG. 3, a circuit of a class-D amplifier according to the invention is shown. This is similar to the circuit of FIG. 1, but also comprises a sampler 15 (in this case, a D-type latch) and a switching circuit (not shown). The switching circuit either bypasses the sampler 15 by shorting the D input to the Q output in operational mode, or opens this connection in the test mode to provide the configuration shown in FIG. 3. Thus, in the operational mode, the circuit is the same as that of FIG. 1, and the output signal, $V_{PWM}$, can be taken from the output of output stage 5. The sampler 15 is driven by an oversampling clock frequency of $2048 f_s$, where $f_s$ is the sampling frequency of the audio input signal to input DAC 1.

Figure 2:
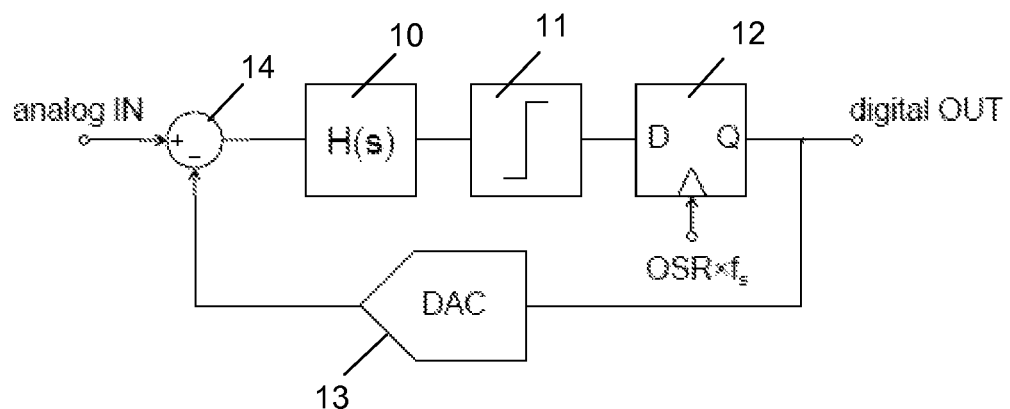
FIG. 2 shows a block diagram of a ΣΔ analogue-to-digital converter.

On the other hand, in the test mode, a digital output signal, out, is made available at the Q output of the sampler 15, and the output stage 5 and feedback resistor 6 serve as a feedback DAC. Thus, in the test mode, the class-D amplifier is effectively reconfigured to have a structure that is the same as that of the ΣΔ ADC shown in FIG. 2.

The effect of the sampler 15 is that it adds quantisation noise to the comp signal. This quantization noise is shaped out-of-band by the second order loop filter formed by first and second integrators 2, 3. In ΣΔ ADCs, a fourth or higher order loop filter is usually required to achieve an adequate SNR in the audio bandwidth. The second order loop filter formed by first and second integrators 2, 3 is less effective but still good enough to allow reliable measurements in a limited frequency range. Measurements have shown that the test mode of FIG. 3 is capable of performing audio tests up to about 5 kHz. For frequencies higher than 5 kHz, the quantization noise rises with a second order slope (i.e. 12 dB/octave). The 5 kHz bandwidth is sufficient for testing purposes. For example, if the SNR measured in the 5 kHz bandwidth is according to specification, it is extremely unlikely that the SNR in the 20 kHz bandwidth would deviate significantly. In another example, total harmonic distortion (THD) is usually dominated by the third harmonic, which fits nicely in the 5 kHz bandwidth when a 1 kHz input signal is used. This 1 kHz input signal can also used to determine the gain. For power supply rejection (PSR), a test signal with an even lower frequency of 217 Hz is applied and offset is measured at DC.

In ΣΔ ADCs performance is limited by the feedback DAC, which is also true in the arrangement shown in FIG. 3 (i.e. when in the test mode), and this can limit the accuracy of the measurements. On the other hand, in the direct PWM feedback loop shown in FIG. 1 (i.e. when in the operational mode), the audio performance is mainly determined by the input DAC 1 and the first integrator 2 in the loop. The output stage 5 is at the end of the forward path in the loop so the contribution of errors from output stage 5 is suppressed with the loop gain. In the test mode shown in FIG. 3, this is no longer true. The output stage 5 is now in the feedback loop and the inverse of all errors contributed by output stage 5 will now appear at the digital output from sampler 15, out.

For example, if in the output stage 5 the rising and falling edges are not perfectly matched, this results in an offset at the output of output stage 5. Consequently, the offset in the out signal is the sum of the offset contributions of the input DAC 1 and first integrator 2 plus the inverse of the output stage 5. This can become a problem if the offset contributed by the output stage 5 is of the same or greater magnitude than the other offset contributions. The same reasoning also applies to the other measurements but the influence of the output stage 5 is especially strong for offset and power supply rejection.

Figure 4:
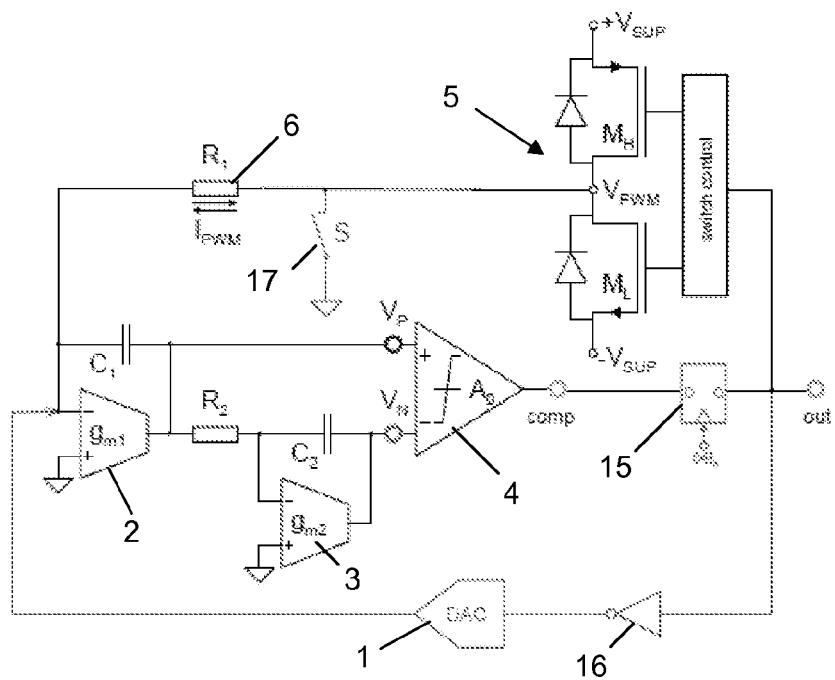
FIG. 4 shows a second embodiment according to the invention.

For offset and power supply rejection measurements the alternative configuration shown in FIG. 4 can be used. In this configuration, the output stage 5 is eliminated from the loop by shorting the output to signal ground with switch 17. Instead, the input DAC 1 is now used as a feedback DAC by coupling the Q output of sampler 15 to the input of input DAC 1 via an inverting buffer amplifier 16 as shown. This is achieved by a switch (not shown) that is open in the operational mode and closed in the test mode to couple the output of buffer amplifier 16 to the input of input DAC 1; the Q output of sampler 15 may be permanently coupled to the input of buffer amplifier 16 or only coupled via another switch (not shown) when in the test mode. In this configuration only the offset contributions of the input DAC 1 and first integrator 2 appear at the output out. This configuration is again very similar to the ΣΔ ADC shown in FIG. 2, but without a signal input. The output signal, out, is pulse-density modulated (PDM) instead of PWM. In order to reduce the average switching frequency the flip-flop can be clocked at a much lower clock rate, e.g. $64 \times f_s$.

The configurations shown in FIGS. 3 and 4 both add only a minimal amount of hardware and reuse the already available circuits to perform the required measurements. The additional switching hardware is straightforward to implement and sampler 15 may be implemented using standard CMOS or any other type of logic circuitry.

When the PWM control loop is reconfigured as ΣΔ ADC, the input and output signals are all in the digital domain. If the amplifier is a stand-alone product this allows fast and robust data communication between the class-D amplifier under test and the tester. If the amplifier is part of a bigger system that includes a DSP, it is possible to do both the signal generation and post-processing of the output signal on the integrated circuit being tested, thus relaxing the data exchange requirements between the device under test and the tester.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. An integrated circuit comprising a Class-D amplifier for amplifying an input signal at an input terminal, the Class-D amplifier being switchable between an operational mode, in which a comparator is directly coupled to an output stage, and a test mode, in which the comparator is coupled to the output stage via a sampler and the output stage is coupled to the input terminal via a feedback network, whereby a digital representation of the input signal is available at an output of the sampler.

2. An integrated circuit according to claim 1, wherein the output stage is coupled to an output terminal.

3. An integrated circuit according to claim 1, further comprising an input digital-to-analogue converter (DAC) with an output coupled to the input terminal.

4. An integrated circuit according to claim 3, wherein the output of the sampler is coupled to an input of the input DAC and the output stage is coupled to a ground terminal via a switch.

5. An integrated circuit according to claim 4, wherein the output of the sampler is coupled to an input of the input DAC via a buffer.

6. An integrated circuit according to claim 5, wherein the buffer is an inverting buffer.

7. An integrated circuit according to claim 1, further comprising a low-pass filter between the input terminal and the comparator.

8. An integrated circuit according to claim 7, wherein the low-pass filter is a second order low-pass filter.

9. An integrated circuit according to claim 1, wherein the feedback network is a resistor coupled from the output stage to the input terminal.

10. An integrated circuit according to claim 1, wherein the sampler is driven by a clock running at an oversampling frequency.

11. An integrated circuit according to claim 1, further comprising a digital signal processor (DSP) for receiving the digital representation at the output of the sampler and analysing the received digital representation in accordance with a predetermined test protocol.

12. A method of testing an integrated circuit according to claim 1, the method comprising:
  switching the integrated circuit into the test mode,
  coupling a test signal to the input terminal,
  receiving the digital representation at the output of the sampler, and
  analysing the output signal in accordance with a predetermined test protocol.

13. A method of testing an integrated circuit according to claim 12, wherein the predetermined test protocol includes analyses of the signal-to-noise ratio (SNR), total harmonic distortion (THD) and power supply rejection (PSR).

14. A method of testing an integrated circuit according to claim 12, wherein the analysis of the output signal in accordance with the predetermined test protocol is performed by a digital signal processor (DSP) integrated on the integrated circuit.

* * * * *